(12) United States Patent
Yen et al.

(10) Patent No.: US 9,748,325 B2
(45) Date of Patent: Aug. 29, 2017

(54) INTEGRATED INDUCTOR STRUCTURE AND METHOD FOR MANUFACTURING THE SAME

(71) Applicant: Realtek Semiconductor Corporation, Hsinchu (TW)

(72) Inventors: Hsiao-Tsung Yen, Hsinchu (TW); Chia-Jui Liang, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 7 days.

(21) Appl. No.: 14/716,898

(22) Filed: May 20, 2015

(65) Prior Publication Data

US 2016/0218169 A1   Jul. 28, 2016

(30) Foreign Application Priority Data

Jan. 27, 2015 (TW) .................. 104102725

(51) Int. Cl.
| | | |
|---|---|---|
| *H01L 49/02* | (2006.01) | |
| *H01L 23/58* | (2006.01) | |
| *H01L 23/522* | (2006.01) | |
| *H01L 27/06* | (2006.01) | |
| *H01L 29/94* | (2006.01) | |
| *H01L 29/93* | (2006.01) | |
| *H01L 27/01* | (2006.01) | |

(52) U.S. Cl.
CPC .......... *H01L 28/10* (2013.01); *H01L 23/5225* (2013.01); *H01L 23/5227* (2013.01); *H01L 23/585* (2013.01); *H01L 27/016* (2013.01); *H01L 23/5223* (2013.01); *H01L 27/0682* (2013.01); *H01L 28/20* (2013.01); *H01L 28/40* (2013.01); *H01L 28/60* (2013.01); *H01L 29/93* (2013.01); *H01L 29/94* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,236,101 B1 * | 5/2001 | Erdeljac .............. | H01L 23/5223 257/531 |
| 6,294,834 B1 * | 9/2001 | Yeh ..................... | H01L 23/4825 257/347 |
| 6,310,387 B1 | 10/2001 | Seefeldt et al. | |
| 8,456,910 B2 * | 6/2013 | Lukashevich ...... | G11C 16/0433 257/371 |
| 2004/0029404 A1 * | 2/2004 | Lin ....................... | H01L 23/522 257/300 |
| 2007/0052062 A1 * | 3/2007 | Ding .................... | H01L 23/5223 257/528 |
| 2009/0322446 A1 * | 12/2009 | Daley ................. | H01L 23/5222 333/185 |
| 2010/0259319 A1 * | 10/2010 | Chan ...................... | H03F 1/565 327/563 |

(Continued)

*Primary Examiner* — William Coleman
*Assistant Examiner* — Kien Ly
(74) *Attorney, Agent, or Firm* — CKC & Partners Co., Ltd.

(57) ABSTRACT

An integrated inductor structure includes a capacitor, a guard ring, a patterned shield, and an inductor. The guard ring is coupled to the capacitor. The patterned shield is coupled to the guard ring through the capacitor, such that the patterned shield is floating. The inductor is disposed above the guard ring and the patterned shield.

10 Claims, 8 Drawing Sheets

(56) References Cited

U.S. PATENT DOCUMENTS

| | | | | |
|---|---|---|---|---|
| 2010/0289108 A1* | 11/2010 | Meinel | ............... | H01L 21/764 |
| | | | | 257/467 |
| 2014/0361401 A1* | 12/2014 | Wang | ............... | H01L 23/5225 |
| | | | | 257/531 |
| 2014/0361417 A1* | 12/2014 | Liu | ............... | H01L 23/5227 |
| | | | | 257/659 |
| 2015/0042415 A1* | 2/2015 | Hurwitz | ............... | H03H 3/00 |
| | | | | 333/185 |
| 2016/0315136 A1* | 10/2016 | Yen | ............... | H01L 28/10 |

* cited by examiner

US 9,748,325 B2

INTEGRATED INDUCTOR STRUCTURE AND METHOD FOR MANUFACTURING THE SAME

RELATED APPLICATIONS

This application claims priority to Taiwan Application Serial Number 104102725, filed Jan. 27, 2015, which is herein incorporated by reference.

BACKGROUND

Field of Invention

The present invention relates to a semiconductor structure and a method for manufacturing the semiconductor structure. More particularly, the present invention relates to an integrated inductor structure and a method for manufacturing the integrated inductor structure.

Description of Related Art

With progression of technology, an integrated inductor process has been developed toward 28 nm and 20 nm processes. In such miniature dimensions, there exist lots of negative effects due to the miniature size of the integrated inductor. For example, because the oxide layer of the integrated inductor is thinner, the capacitance thereof is higher; because redistribution layers (RDLs) adopted in the integrated inductor are thicker, the capacitance among the redistribution layers is higher; and so on. Those situations will affect inductor quality factors.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present invention or delineate the scope of the present invention.

One aspect of the present disclosure is directed to an integrated inductor structure. The integrated inductor structure includes a capacitor, a guard ring, a patterned shield, and an inductor. The guard ring is coupled to the capacitor. The patterned shield is coupled to the guard ring through the capacitor, such that the patterned shield is floating. The inductor is disposed above the guard ring and the patterned shield.

Another aspect of the present disclosure is directed to a method for manufacturing an integrated inductor structure. The method includes the steps of:

forming a capacitor;

forming a guard ring to be coupled to the capacitor;

forming a patterned shield to be coupled to the guard ring through the capacitor, thereby floating the patterned shield; and forming an inductor above the guard ring and the patterned shield.

In view of the foregoing, embodiments of the present disclosure provide an integrated inductor structure and a method for manufacturing the integrated inductor structure to improve the problems of the decreased inductor quality factor.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

Figure 1:
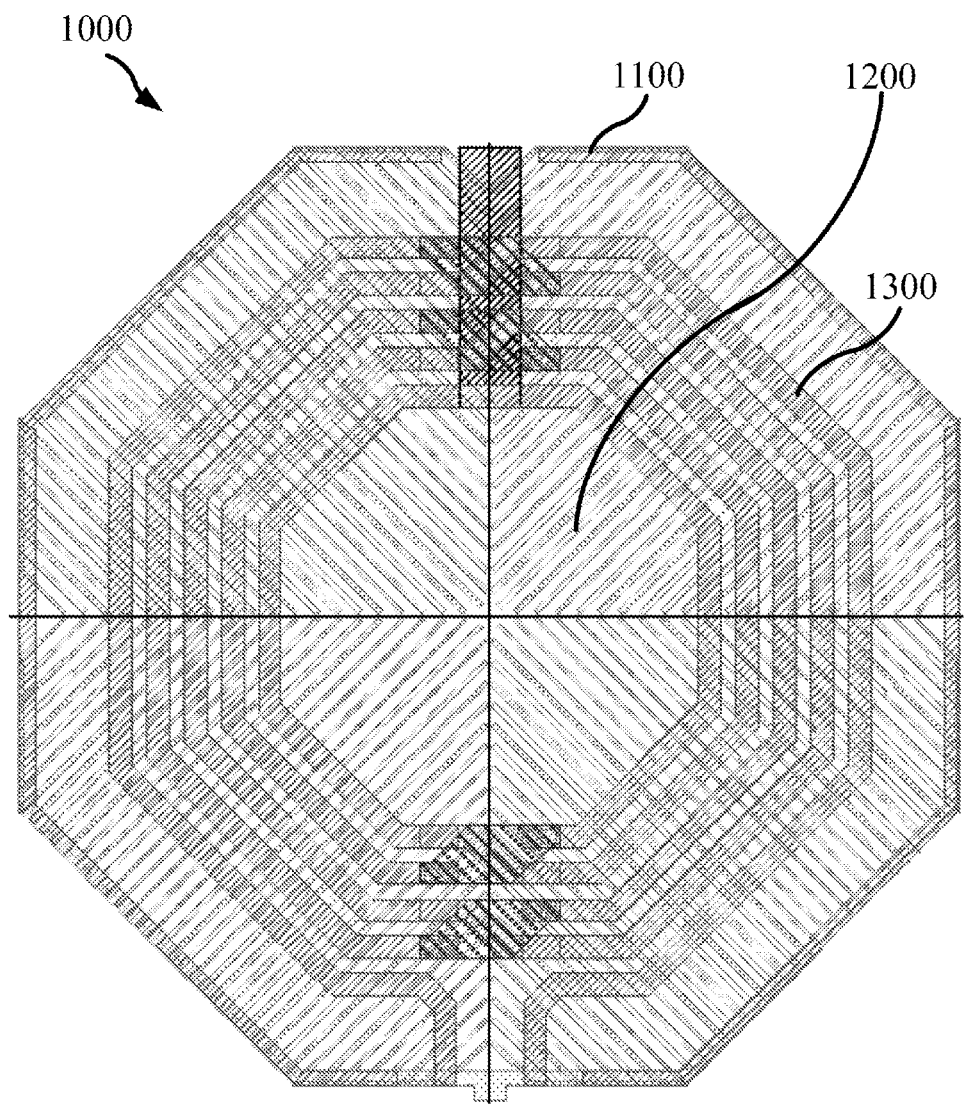
FIG. 1 is a schematic diagram of an integrated inductor structure according to some embodiments of the present invention.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

For improving the inductor quality factor, embodiments of the present invention provide an integrated inductor structure and a method for manufacturing the integrated inductor structure. An integrated inductor structure 1000 is illustrated in FIG. 1. As shown in FIG. 1, the integrated inductor structure 1000 includes a guard ring 1100, a patterned shield 1200, and an inductor 1300. The way of the present invention to improve the inductor quality factor is to improve the structures of the guard ring 1100 and the patterned shield 1200, which will be described below.

Figure 2:
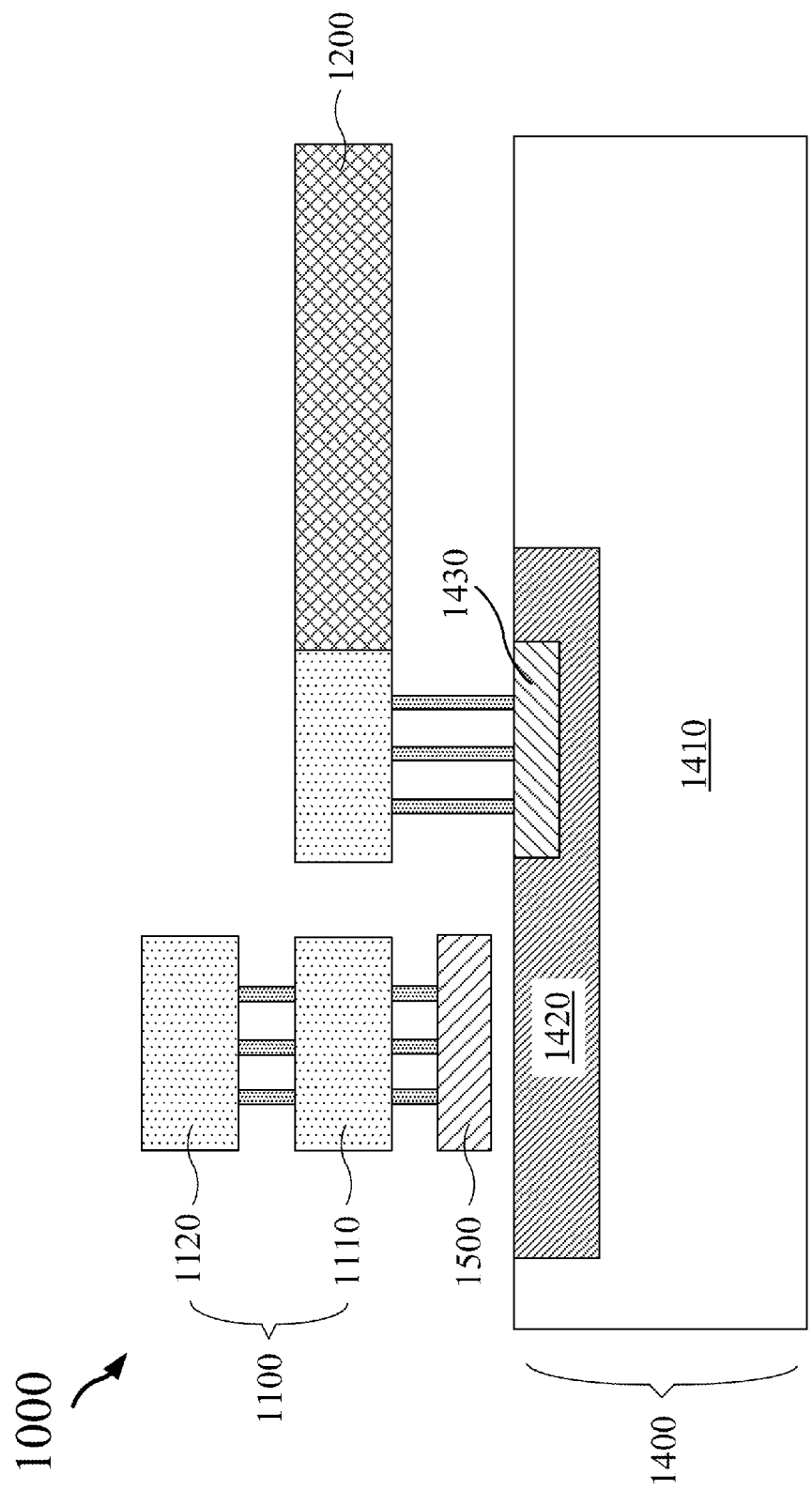
FIG. 2 is a schematic cross-section diagram of the integrated inductor structure of FIG. 1 according to some embodiments of the present invention.

FIG. 2 is a schematic cross-section diagram of the integrated inductor structure of FIG. 1 according to some embodiments of the present invention. As shown in the figure, the integrated inductor structure 1000 includes a capacitor 1400, a guard ring 1100, a patterned shield 1200, and an inductor 1300 (now shown). With respect to structure, the guard ring 1100 is coupled to the capacitor 1400. The patterned shield 1200 is coupled to the guard ring 1100 through the capacitor 1400, such that the patterned shield 1200 is floating. The inductor 1300 is disposed above the guard ring 1100 and the patterned shield 1200.

It is noted that the patterned shield 1200 can also be coupled to ground. In this situation, the patterned shield 1200 is referred to as a patterned ground shield (PGS), and functions thereof will be described below. When the inductor 1300 of the integrated inductor structure 1000 operates, there is eddy current generated on a substrate. The eddy current will affect the quality factor of the inductor 1300. If the PGS is disposed between the inductor 1300 of the integrated inductor structure 1000 and the substrate, the PGS can be regard as a shield to prevent eddy current from being generated on the substrate when the inductor 1300 operates. Therefore, the inductor quality factor can be improved. In one embodiment, the line width of the guard ring 1100 can be about 0.05 um-10 um. The distance between the guard ring 1100 and the inductor 1300 may have different design ranges for different inductors, and the possible design range is about 2 um-25 um.

Furthermore, since the integrated inductor process has been developed toward 28 nm and 20 nm processes. In this miniature dimension, there exist lots of negative effects due to the miniature size of the integrated inductors. For improving the negative effects, the integrated inductor structure 1000 of the present invention further implement the capacitor 1400 between the guard ring 1100 and the patterned shield 1200, thereby floating the patterned shield 1200. In other words, the patterned shield 1200 is not directly coupled to ground. The foregoing structure enables the patterned shield 1200 and the capacitor 1400 to form a filtering circuit for filtering out direct signals and low frequency signals. Therefore, direct signals and low frequency signals can be filtered out to prevent such signals from affecting the inductor 1300 of the integrated inductor structure 1000, such that the quality factor of the inductor 1300 can be improved, and the efficiency of the integrated inductor structure 1000 can be enhanced.

In another embodiment, the capacitor 1400 includes a MOS varactor, and the MOS varactor includes a first-type substrate 1410, a second-type well 1420 and a second-type doped region 1430. In addition, the integrated inductor structure 1000 further includes a polysilicon resistor 1500. With respect to structure, the second-type well 1420 is formed on the first-type substrate 1410. The second-type doped region 1430 is formed on the second-type well 1420 and is coupled to the patterned shield 1200. The polysilicon resistor 1500 is formed above the second-type well 1420 and is coupled to the guard ring 1100. In one embodiment, the guard ring 1100 includes a first metal portion 1110 and a second metal portion 1120. The first metal portion 1110 is disposed in a first metal layer of the integrated inductor structure 1000, and the second metal portion 1120 is disposed in a second metal layer of the integrated inductor structure 1000.

As can be known from the structure of the figure, the patterned shield 1200 and the capacitor 1400 form the filtering circuit for filtering out direct signals and low frequency signals. Therefore, the direct signals and the low frequency signals are filtered out to prevent such signals from affecting the inductor 1300 of the integrated inductor structure 1000, thus improving the quality factor of the inductor 1300. However, the type of the capacitor 1400 of the present invention is not limited to a MOS varactor, and those skilled in the art may selectively employ proper type of capacitor according to actual requirements. For example, those skilled in the art may select a metal-oxide-metal (MOM) capacitor, a metal-insulator-metal (MIM) capacitor, and so on.

In still another embodiment, the value of the capacitor 1400 can be set depending on actual requirements so as to filter signals with different frequency bands. In yet another embodiment, the first-type substrate 1410 can be P-type substrate, the second-type well 1420 can be N-type well, and the second-type doped region 1430 can be N-type doped region. However, the present invention is not limited in this regard, and those skilled in the art may employ N-type substrate to manufacture the first-type substrate 1410 depending on actual requirements. Accordingly, the second-type well 1420 can be P-type well, and the second-type doped region 1430 can be P-type doped region.

Figure 3:
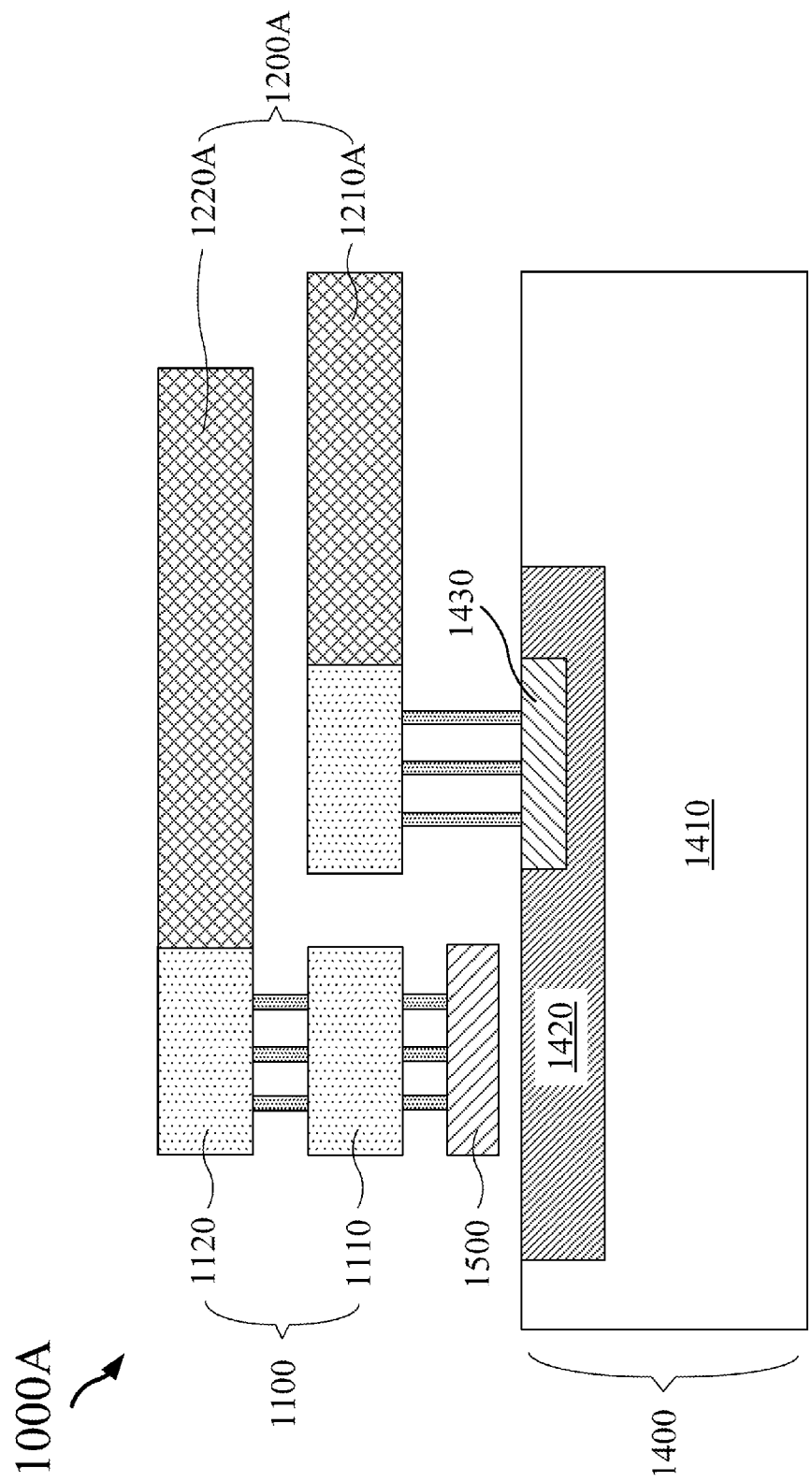
FIG. 3 is a schematic cross-section diagram of the integrated inductor structure of FIG. 1 according to some embodiments of the present invention.

FIG. 3 is a schematic cross-section diagram of the integrated inductor structure of FIG. 1 according to some embodiments of the present invention. The difference between the integrated inductor structure 1000A in FIG. 3 and the integrated inductor structure 1000 in FIG. 2 is that the patterned shield 1200 of the integrated inductor structure 1000A in FIG. 3 includes at least two structures, such as a first patterned shield portion 1210A and a second patterned shield portion 1220A. With respect to structure, the first patterned shield portion 1210A is coupled to the second-type doped region 1430. The second patterned shield portion 1220A is coupled to the guard ring 1100. Specifically, the second patterned shield portion 1220A is coupled to the second metal portion 1120 of the guard ring 1100. In another embodiment, the first patterned shield portion 1210A and the second patterned shield portion 1220A are disposed in a first metal layer and a second metal layer of the integrated inductor structure 1000A respectively. The first patterned shield portion 1210A and the second patterned shield portion 1220A are overlapped or interlaced with each other. Therefore, the first patterned shield portion 1210A and the second patterned shield portion 1220A as a whole form a capacitor for enhancing the signal-filtering capability. In addition, the value of capacitance can be further adjusted based on the overlapped or interlaced relationship of the first patterned shield portion 1210A and the second patterned shield portion 1220A for filtering out signals with different frequency bands. In one embodiment, distances among metal portions in the same metal layer can be different due to different manufacturing processes or different values of capacitance, and the range of the distance can be about 0.01 um-2 um.

Figure 4:
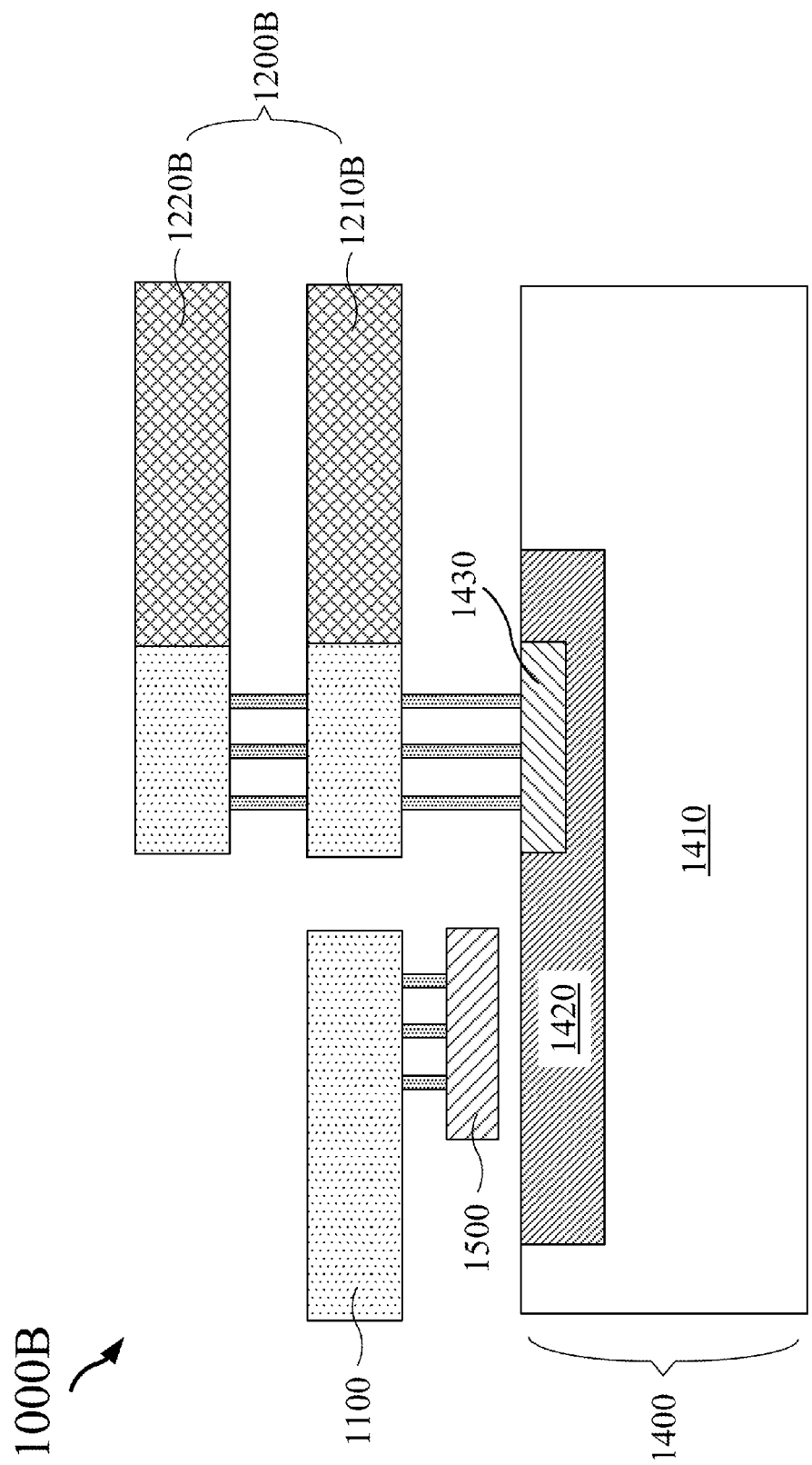
FIG. 4 is a schematic cross-section diagram of the integrated inductor structure of FIG. 1 according to some embodiments of the present invention.

FIG. 4 is a schematic cross-section diagram of the integrated inductor structure of FIG. 1 according to some embodiments of the present invention. The difference between the integrated inductor structure 1000B of FIG. 4 and the integrated inductor structure 1000 of FIG. 2 resides in the disposition of the guard ring 1100 and the patterned shield 1200, which will be described below. As shown in FIG. 4, the patterned shield 1200B includes a first patterned shield portion 1210B and a second patterned shield portion 1220B. With respect to structure, the first patterned shield portion 1210B is disposed in the first metal layer of the integrated inductor structure 1000B and is coupled to the second-type doped region 1430. The second patterned shield portion 1220B is disposed in the second metal layer of the integrated inductor structure 1000B and is coupled to the first patterned shield portion 1210B. In one embodiment, the first patterned shield portion 1210B and the second patterned shield portion 1220B are overlapped or interlaced with each other. Therefore, similar to the structure of FIG. 3, the first patterned shield portion 1210B and the second patterned shield portion 1220B as a whole in FIG. 4 form a capacitor for enhancing the signal-filtering capability. In addition, the value of the capacitance can be further adjusted based on the overlapped or interlaced relationship of the first patterned shield portion 1210B and the second patterned shield portion 1220B for filtering out signals with different frequency bands.

Figure 5:
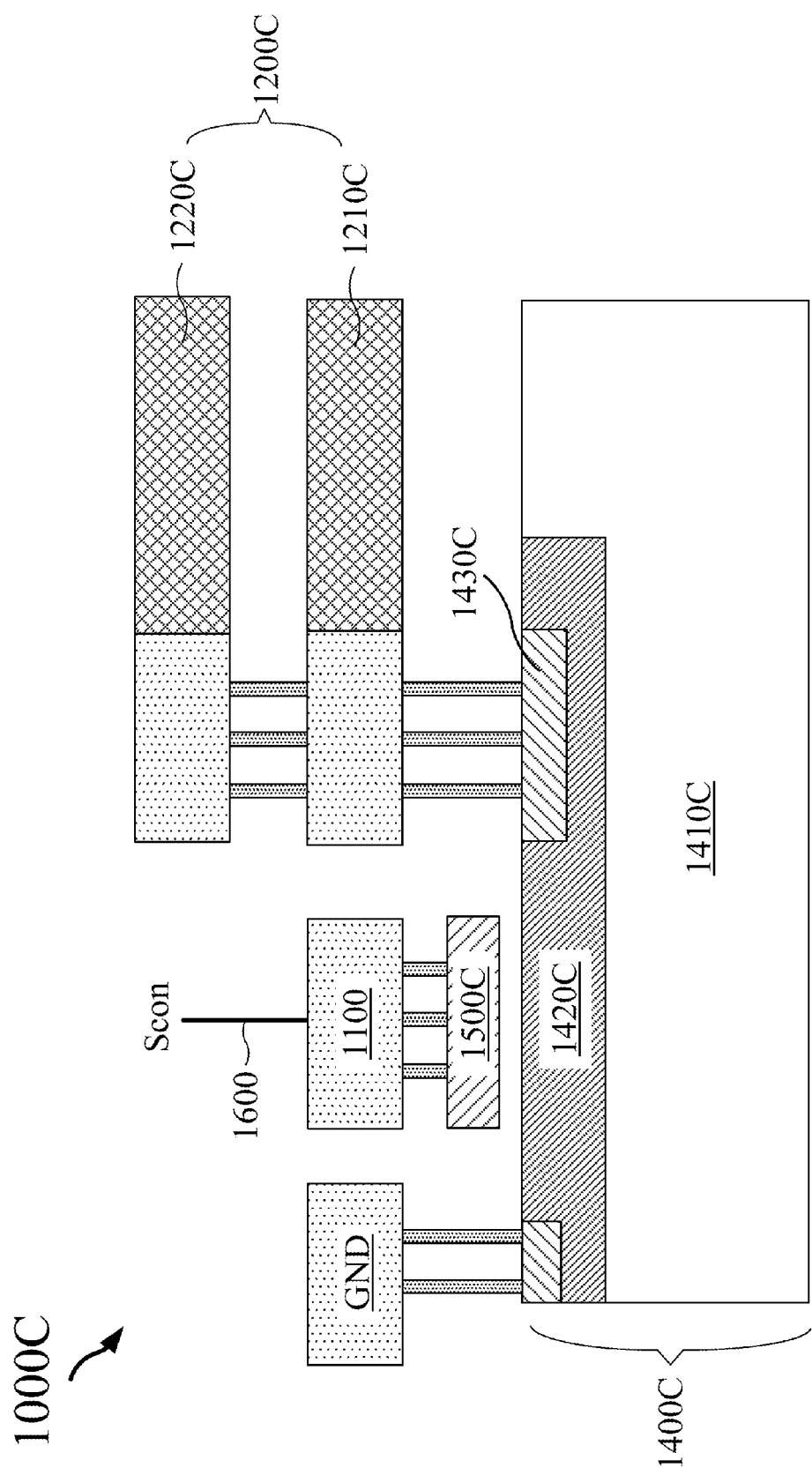
FIG. 5 is a schematic cross-section diagram of the integrated inductor structure of FIG. 1 according to embodiments of the present invention.

FIG. 5 is a schematic cross-section diagram of the integrated inductor structure of FIG. 1 according to some embodiments of the present invention. The difference between the integrated inductor structure 1000C in FIG. 5 and the integrated inductor structure 1000 in FIG. 1 resides in the disposition of the guard ring 1100, the patterned shield 1200, and the capacitor 1400, which will be described below. As shown in FIG. 5, the capacitor 1400C includes a MOS varactor, and the MOS varactor includes a first-type substrate 1410C, a first-type well 1420C and a second-type doped region 1430C. In addition, the integrated inductor structure 1000C further includes a polysilicon resistor 1500C.

With respect to structure, the first-type well 1420C is formed on the first-type substrate 1410C and is coupled to ground through a ground terminal GND. The second-type doped region 1430C is formed on the first-type well 1420C and is coupled to the patterned shield 1200C. The polysilicon resistor 1500C is formed above the first-type well 1420C and is coupled to the guard ring 1100. In addition, the guard ring 1100 is coupled to the control line 1600. The first-type well 1420C and the second-type doped region 1430C are conducted by a control signal Scon provided by the control line 1600.

In another embodiment, the first-type substrate 1410C can be a P-type substrate, the first-type well 1420C can be a P-type well, and the second-type doped region 1430C can be a N-type doped region. Substrate, 1410 can be n type or p type substrate, where well structure, 1420, can be pwell or nwell. However, the present invention is not limited in this regard, and those skilled in the art can selectively employ proper material according to actual requirements. It is noted that, since the first-type well 14200 and the second-type doped region 1430C are manufactured by different types of material, the first-type well 1420C and the second-type doped region 1430C can be conducted or not conducted by the control signal Scon (for example, bias) provided by the control line 1600. In view of the above, the integrated inductor structure 1000C of embodiments of the present invention can further control the filtering circuit (formed by the capacitor 1400C and the patterned shield 1200C) through the above-mentioned structure, such that the filtering circuit may be turned on or off. Therefore, the operation flexibility of the integrated inductor structure 1000C can be enhanced, and the operation range of the integrated inductor structure 1000C can be expanded.

Figure 6:
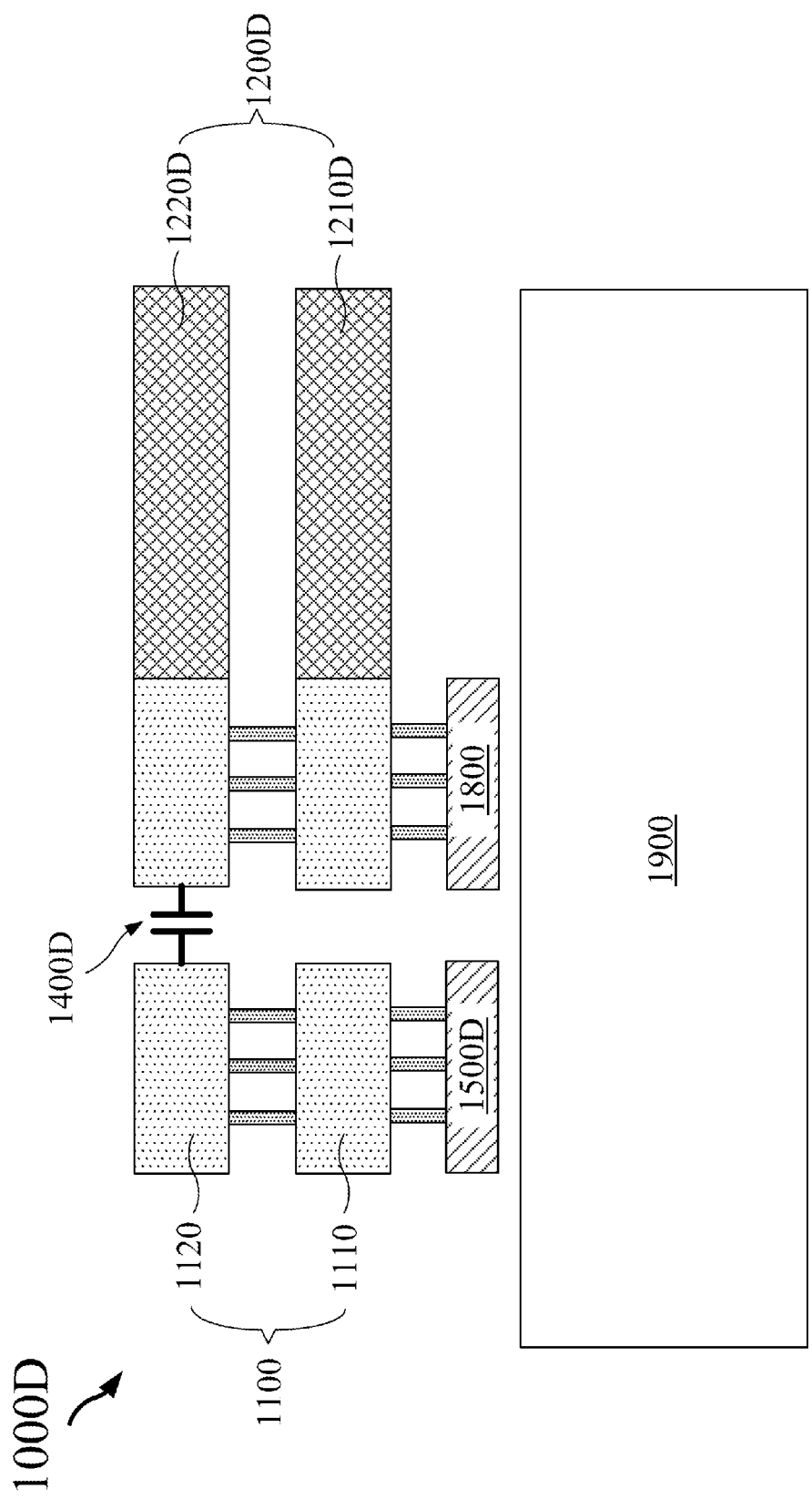
FIG. 6 is a schematic cross-section diagram of the integrated inductor structure of FIG. 1 according to some embodiments of the present invention.

FIG. 6 is a schematic cross-section diagram of the integrated inductor structure of FIG. 1 according to some embodiments of the present invention. The difference between the integrated inductor structure 1000D in FIG. 6 and the integrated inductor structure 1000 in FIG. 1 resides in the disposition of the patterned shield 1200D and the capacitor 1400D, which will be described below. As shown in FIG. 6, the integrated inductor structure 1000D further includes a substrate 1900, a first polysilicon resistor 1500D, and a second polysilicon resistor 1800. In addition, the patterned shield 1200D includes a first patterned shield portion 1210D and a second patterned shield portion 1220D.

With respect to structure, the first polysilicon resistor 1500D is formed above the substrate 1900 and is coupled to the guard ring 1100. The second polysilicon resistor 1800 is formed above the substrate 1900. The first patterned shield portion 1210D is disposed in a first metal layer of the integrated inductor structure 1000D and is coupled to the second polysilicon resistor 1800. The second patterned shield portion 1220D is disposed in a second metal layer of the integrated inductor structure 1000D and is coupled to the first patterned shield portion 1210D. In another embodiment, the first patterned shield portion 1210D and the second patterned shield portion 1220D are overlapped or interlaced with each other.

Figure 7:
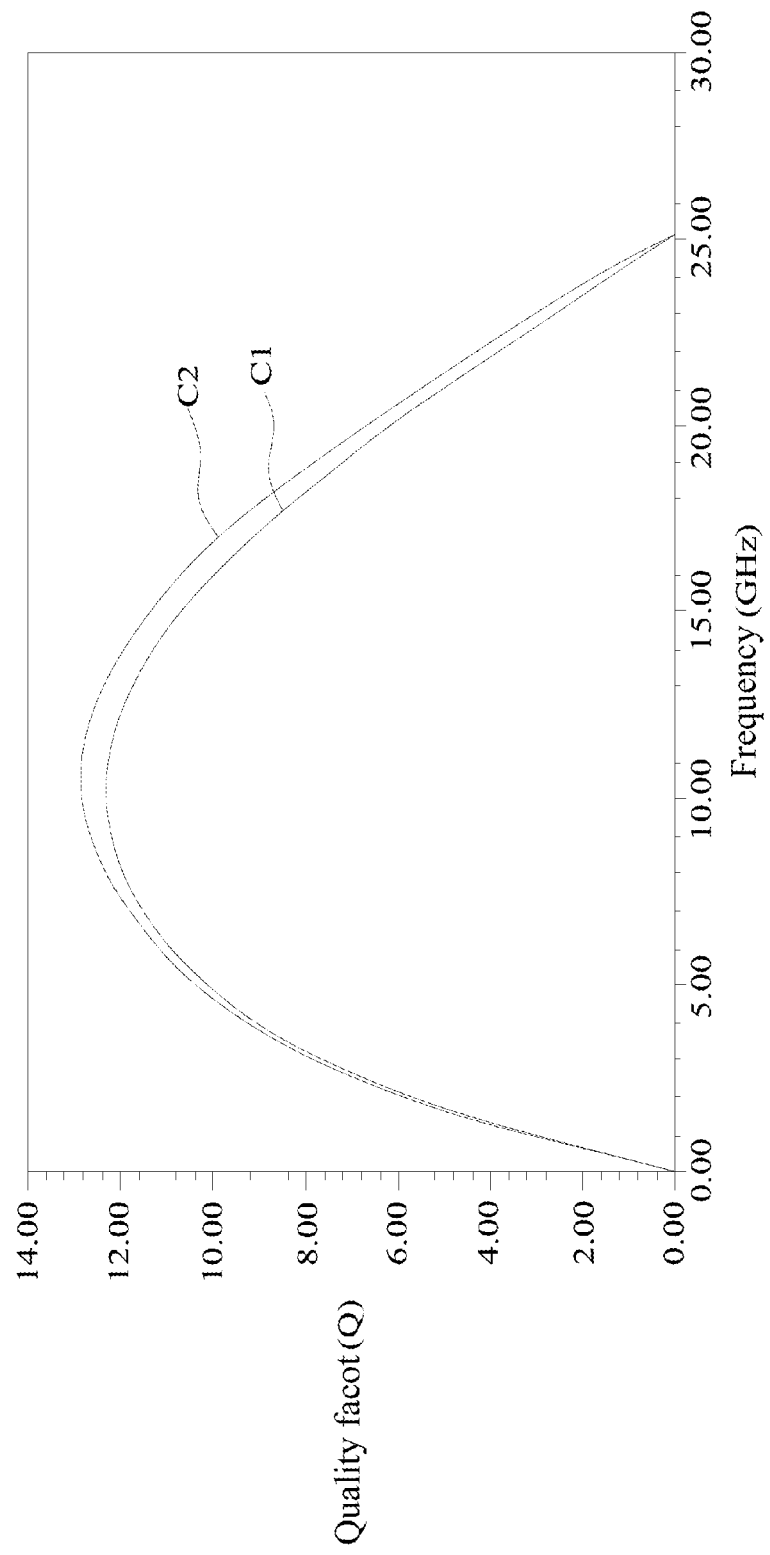
FIG. 7 is an experimental data diagram of an integrated inductor structure according to some embodiments of the present invention.

FIG. 7 is an experimental data diagram of an integrated inductor structure according to some embodiments of the present invention. This experimental data diagram is used for describing the inductor quality factors of the integrated inductor structure when the inductor operates in different frequencies. As shown in the figure, the curve C1 represents an experimental data if the patterned shield of the integrated inductor structure is directly connected to ground. The curve C2 represents an experimental data if the patterned shield of the integrated inductor structure is not directly connected to ground. As shown in FIG. 7, the integrated inductor structure of the present invention indeed can improve the inductor quality factor of the integrated inductor structure and enhance the efficiency of the integrated inductor structure.

Figure 8:
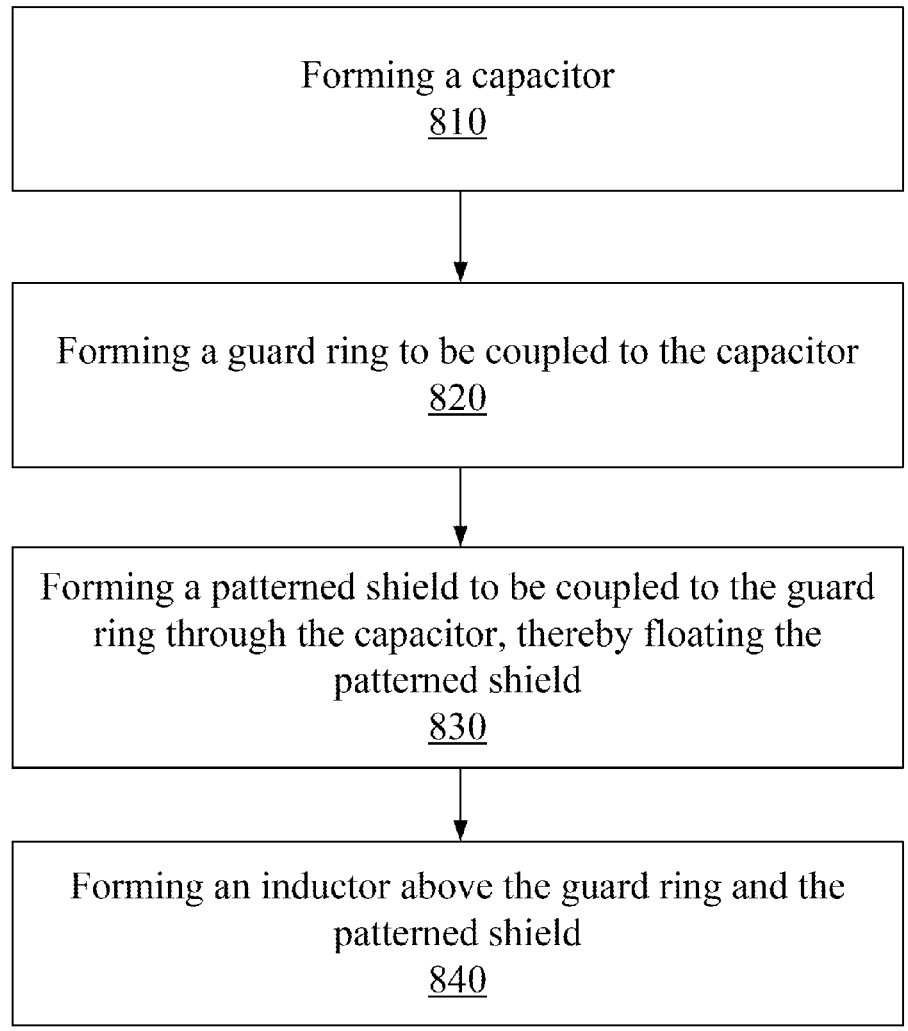
FIG. 8 is a flow chart illustrating a method for manufacturing an integrated inductor structure according to some embodiments of the present disclosure.

FIG. 8 is a flow chart illustrating process steps of a method for manufacturing an integrated inductor structure according to some embodiments of the present disclosure. The method 800 for manufacturing an integrated inductor structure includes the following steps:

step 810: forming a capacitor;
step 820: forming a guard ring to be coupled to the capacitor;
step 830: forming a patterned shield to be coupled to the guard ring through the capacitor, hereby floating the patterned shield; and
step 840: forming an inductor above the guard ring and the patterned shield.

For facilitating understanding of the method 800 for manufacturing the integrated inductor structure of embodiments of the present invention, please refer to FIGS. 1, 2 and 8. In step 810, the capacitor 1400 is formed. Next, in step 820, the guard ring 1100 is formed and is coupled to the capacitor 1400. Subsequently, in step 830, the patterned shield 1200 is formed to be coupled to the guard ring 1100 through the capacitor 1400 for floating the patterned shield 1200. Thereafter, in step 840, the inductor 1300 is formed above the guard ring 1100 and the patterned shield 1200. Description regarding improving the inductor quality factor by the integrated inductor structure 1000 manufactured by the method 800 has been provided in the description of FIG. 2, and thus the detail description thereof is omitted herein for the sake of brevity.

In another embodiment, reference is now made to both FIG. 2 and FIG. 8, the step of forming the capacitor includes: forming the first-type substrate 1410; forming the second-type well 1420 on the first-type substrate 1410; forming the second-type doped region 1430 on the second-type well 1420 and coupling the second-type doped region 1430 to the patterned shield 1200; and forming the polysilicon resistor 1500 above the second-type well 1420 and coupling the polysilicon resistor 1500 to the guard ring 1100.

In still another embodiment, reference is now made to both FIG. 3 and FIG. 8, the step of forming the patterned shield to be coupled to the guard ring through the capacitor includes: forming the first patterned shield portion 1210A to be coupled to the second-type doped region 1430; and forming the second patterned shield portion 1220A to be coupled to the guard ring 1100. The first patterned shield portion 1210A and the second patterned shield portion 1220A is formed in the first metal layer and the second metal layer of the integrated inductor structure 1000A respectively, and the first patterned shield portion 1210A and the second patterned shield portion 1220A are overlapped or interlaced with each other. Description regarding improving the inductor quality factor by the integrated inductor structure 1000A manufactured by the method 800 has been provided in the description of FIG. 3, and thus the detail description thereof is omitted herein for the sake of brevity.

In yet another embodiment, reference is now made to both FIG. 4 and FIG. 8, the step of forming the patterned shield which is coupled to the guard ring through the capacitor includes: forming the first patterned shield portion 1210B in the first metal layer of the integrated inductor structure 1000B and coupling the first patterned shield portion 1210B to the second-type doped region 1430; and forming the second patterned shield portion 1220B in the second metal layer of the integrated inductor structure 1000B and coupling the second patterned shield portion 1220B to the first patterned shield portion 1210B. In still another embodiment, the first patterned shield portion 1210B and the second patterned shield portion 1220B are overlapped or interlaced with each other. Description regarding improving the inductor quality factor by the integrated inductor structure 1000B manufactured by the method 800 has been provided in the description of FIG. 4, and thus the detail description thereof is omitted herein for the sake of brevity.

In another embodiment, reference is now made to both FIG. 5 and FIG. 8, the step of forming the capacitor includes: forming the first-type substrate 14100; forming the first-type well 1420C on the first-type substrate 1410C and coupling the first-type well 1420C to ground GND; forming the second-type doped region 14300 on the first-type well 1420C and coupling the second-type doped region 1430C to the patterned shield 1200; and forming the polysilicon resistor 1500C above the first-type well 1420C and coupling the polysilicon resistor 1500C to the guard ring 1100. The method 800 for manufacturing the integrated inductor structure further includes: coupling the control line 1600 to the guard ring 1100; and turning on the first-type well 1420C and the second-type doped region 1430C by the control signal Scon provided by the control line 1600. In still another embodiment, forming the patterned shield which is coupled to the guard ring through the capacitor comprises: forming the first patterned shield portion 1210C in the first metal layer of the integrated inductor structure 1000C and coupling the first patterned shield portion 1210C to the second-type doped region 14300; and forming the second patterned shield portion 12200 in the second metal layer of the integrated inductor structure 10000 and coupling the second patterned shield portion 1220C to the first patterned shield portion 1210C. Description regarding improving the inductor quality factor by the integrated inductor structure 1000C manufactured by the method 800 has been provided in the description of FIG. 5, and thus the detail description thereof is omitted herein for the sake of brevity.

In still another embodiment, reference is now made to both FIG. 6 and FIG. 8, the method 800 for manufacturing the integrated inductor structure further includes: forming the substrate 1900; forming the first polysilicon resistor 1500D above the substrate 1900 and coupling the first polysilicon resistor 1500D to the guard ring 1100; and forming the second polysilicon resistor 1800 above the substrate 1900. In addition, the step of forming the patterned shield which is coupled to the guard ring through the capacitor includes: forming the first patterned shield portion 1210D in the first metal layer of the integrated inductor structure 1000D and coupling the first patterned shield portion 1210D to the second polysilicon resistor 1800; and forming the second patterned shield portion 1220D in the second metal layer of the integrated inductor structure 1000D and coupling the second patterned shield portion 1220D to the first patterned shield portion 1210D. In yet another embodiment, the first patterned shield portion 1210D and the second patterned shield portion 1220D are overlapped or interlaced with each other. Description regarding improving the inductor quality factor by the integrated inductor structure 1000D manufactured by the method 800 has been provided in the description of FIG. 6, and the detail description thereof is omitted herein for the sake of brevity.

In view of the above embodiments of the present disclosure, it is apparent that the application of the present invention has the following advantages. Embodiments of the present disclosure provide an integrated inductor structure and a method for manufacturing the integrated inductor structure. The patterned shield and the capacitor of the integrated inductor structure form a filtering circuit for filtering out direct signals and low frequency signals since the patterned shield is not directly connected to ground. Therefore, the direct signals and the low frequency signals are filtered out so as to prevent such signals from affecting the inductor of the integrated inductor structure, such that the inductor quality factor can be improved, and the efficiency of the integrated inductor structure can be enhanced. In addition, the value of the capacitor can be set according to actual requirements so as to filter out signals with different frequency bands. In addition, the integrated inductor structure of embodiments of the present invention can further control the filtering circuit (formed by the capacitor and the patterned shield) through the above-mentioned structure. Accordingly, the filtering circuit may be turned on or off. Therefore, the operation flexibility of the integrated inductor structure can be enhanced, and the operation range of the integrated inductor structure can be expanded.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated inductor structure, comprising:
   a capacitor;
   a guard ring coupled to the capacitor;
   a patterned shield, comprising:

a first patterned shield portion disposed in a first metal layer, connected to the capacitor, and coupled to the guard ring through the capacitor, thereby floating the patterned shield; and a second patterned shield portion disposed in a second metal layer and connected to the guard ring, wherein the second metal layer is above and separated from the first metal layer; and an inductor disposed above the guard ring and the patterned shield.

2. The integrated inductor structure of claim 1, wherein the capacitor comprises a MOS varactor, and the MOS varactor comprises:

a first-type substrate;

a second-type well formed on the first-type substrate; and a second-type doped region which is formed on the second-type well and is coupled to the patterned shield;

wherein the integrated inductor structure further comprises:

a polysilicon resistor formed above the second-type well and coupled to the guard ring.

3. The integrated inductor structure of claim 2, wherein the first patterned shield portion is coupled to the second-type doped region.

4. The integrated inductor structure of claim 3, wherein the first patterned shield portion and the second patterned shield portion are overlapped or interlaced with each other.

5. The integrated inductor structure of claim 1, wherein the capacitor comprises a MOS varactor, and the MOS varactor comprises:

a first-type substrate;

a first-type well formed on the first-type substrate and coupled to a ground; and a second-type doped region formed on the first-type well and coupled to the patterned shield;

wherein the integrated inductor structure further comprises:

a polysilicon resistor which is formed above the first-type well and is coupled to the guard ring;

wherein the guard ring is coupled to a control line, and the first-type well and the second-type doped region are conducted by a control signal provided by the control line.

6. A method for manufacturing an integrated inductor structure, comprising:

forming a capacitor, forming a guard ring to be coupled to the capacitor;

forming a patterned shield, comprising:

forming a first patterned shield portion of the patterned shield disposed in a first metal layer, connected to the capacitor, and coupled to the guard ring through the capacitor, thereby floating the patterned shield; and forming a second patterned shield portion of the patterned shield disposed in a second metal layer and connected to the guard ring, wherein the second metal layer is above and separated from the first metal layer; and forming an inductor above the guard ring and the patterned shield.

7. The method of claim 6, wherein the step of forming the capacitor comprises:

forming a first-type substrate;

forming a second-type well on the first-type substrate;

forming a second-type doped region on the second-type well to be coupled to the patterned shield; and forming a polysilicon resistor above the second-type well to be coupled to the guard ring.

8. The method of claim 7, wherein the step of forming the patterned shield comprises:

forming the first patterned shield portion of the patterned shield coupled to the second-type doped region.

9. The method of claim 8, wherein the first patterned shield portion and the second patterned shield portion are overlapped or interlaced with each other.

10. The method of claim 6, wherein the step of forming the capacitor comprises:

forming a first-type substrate;

forming a first-type well on the first-type substrate to be coupled to a ground;

forming a second-type doped region on the first-type well to be coupled to the patterned shield; and forming a polysilicon resistor above the first-type well to be coupled to the guard ring;

wherein the method further comprises:

coupling a control line to the guard ring; and conducting the first-type well and the second-type doped region by a control signal provided by the control line.

* * * * *